United States Patent [19]

Erhardt

[11] Patent Number: 4,612,579

[45] Date of Patent: Sep. 16, 1986

[54] TIME-DIVISION-MULTIPLEX CLOCKING OF MULTIPLE-CHARGE-TUNNEL CCD STRUCTURES, SUCH AS LINE-TRANSFER CCD IMAGERS

[75] Inventor: Harry G. Erhardt, Somerset County, N.J.

[73] Assignee: RCA Corporation, Princeton, N.J.

[21] Appl. No.: 740,821

[22] Filed: Jun. 3, 1985

[51] Int. Cl.[4] ............................................. H04N 3/14
[52] U.S. Cl. ................................................ 358/213
[58] Field of Search .............................. 358/212, 213; 357/24 LR

[56] References Cited

U.S. PATENT DOCUMENTS 3,971,003  7/1976  Kosonocky ................... 357/24 LR
4,539,596  9/1985  Elabd ................................. 358/213

Primary Examiner—Gene Z. Rubinson
Assistant Examiner—Stephen Brinich
Attorney, Agent, or Firm—Joseph S. Tripoli; George E. Haas; Allen L. Limberg

[57] ABSTRACT

A line-transfer charge-coupled-device (CCD) imager has an image register from which lines of charge packets representing image samples are removed via a plurality of charge funnels. Each charge funnel is a CCD transmission line, wide enough at its input port to connect across the parallelled output ports of a plurality of the parallelled charge transfer channels in the image register of the line-transfer CCD imager, and narrower at its output port which connects to a charge sensing stage. Power for clocking the plurality of charge funnels is conserved when, in accordance with the invention, each of the charge funnels is dynamically clocked for time intervals when charge packets descriptive of image samples are transferred through the charge funnel. The charge funnels receive static clocking voltages at other times.

3 Claims, 3 Drawing Figures

TIME-DIVISION-MULTIPLEX CLOCKING OF MULTIPLE-CHARGE-TUNNEL CCD STRUCTURES, SUCH AS LINE-TRANSFER CCD IMAGERS

FIELD OF THE INVENTION

The present invention relates to electrometers with time-division-multiplex (TDM) charge input circuitry as may be used for example in charge-coupled-device (CCD) imagers of the line transfer type.

BACKGROUND OF THE INVENTION

In a line transfer type of CCD imager, the image register comprises a plurality of paralleled CCD charge transfer channels in which charge packets representative of a radiant energy image are caused to form. The charge packets in each CCD channel represent a line of image response, and these lines of image response are sequentially transferred in respective charge packet trains from the image register. Transfer may be to a common read-out bus connecting the output electrodes for each of the image registers. A disadvantage of using such a read-out bus is that the output signal-to-noise ratio is diminished because of the high capacitance of the long read-out bus. Alternatively, the common read-out bus may be replaced by a CCD charge transfer channel running alongside the imager register, its successive stages arranged for side-loading from respective ones of paralleled charge transfer channels in the image register. The side-loaded CCD charge transfer channel introduces a time skew between the lines in excess of that associated with their being regularly scanned, so delay compensation must be provided to avoid shear distortion in a television image reproduced from the imager output signal.

Alternative ways of reading out the contents of the imager register in a line-transfer CCD imager are described in a U.S. patent application Ser. No. 650,615 entitled "TDM-Input Electrometer, as in a Line Transfer CCD Imager, Using a Charge Funnel", filed Sept. 14, 1984 by P. K. Weimer, and assigned to RCA Corporation. These alternative ways involve the use of a "charge funnel". A charge funnel is a CCD charge transfer channel, wide enough at its input port to connect directly from the parallelled output ports of several or all of the charge transfer channels in the image register, and narrow enough at its output port that a floating-element electrometer provides substantial response to charge level variation at that port. Weimer describes the division of the image register into bands of adjacent charge transfer channels, the output ports of the charge transfer channels in each of these bands being followed by a respective charge funnel. Weimer describes the plurality of charge funnels being dynamically clocked on a continuous basis and in synchronism with each other.

There are a number of advantages in using a plurality of smaller charge funnels in the line transfer CCD imager, rather than one larger charge funnel, for conveying charge packets from the image register to the electrometer. The rate at which the width of the charge funnel can narrow is constrained by the need to keep the effective length of charge transfers small, so that charge transfers are as complete as possible, in order to avoid image lag. So the minimum length of a charge funnel is determined by the width of its input port. The parallelly disposed input ports of the plurality of smaller charge funnels are narrower than the input port of the single charge funnel they replace, so the length of each of them can be shorter. The shorter length of each of the plurality of smaller charge funnels means there is less time delay through them. This facilitates the changes in image register clocking, when different lines are selected for forward charge transfer, not coupling to the electrometer input during line trace portions of the electrometer output signal. This places the line selection artifacts in the line retrace intervals, so they can be suppressed by blanking the electrometer output signal line during line retrace.

The reduction of charge funnel length, together with the width of its input port, causes the area taken up on imager die by the plurality of charge funnels to be smaller than that area that would be taken up by the single charge funnel. The smaller area of the plurality of smaller charge funnels means that the overall capacitance between gate electrodes and substrate is smaller. So less power is required to clock charge packets through the plurality of smaller charge funnels. However, there is still a desire to further reduce clocking power dissipation in the line transfer CCD imager camera.

SUMMARY OF THE INVENTION

The clocking power required for an imager using a plurality of charge funnels is conserved, in accordance with the present invention, by dynamically clocking each charge funnel in succession, without a substantial overlap of their dynamic clocking times. In preferred embodiments of the invention the dynamic clocking of each charge funnel proceeds substantially for only such a time as required to transfer trains of charge packets descriptive of image scan lines, from the associated band of image register charge transfer channels, to a charge sensing imager output stage, along a charge transfer path through that charge funnel.

DETAILED DESCRIPTION

Figure 1:
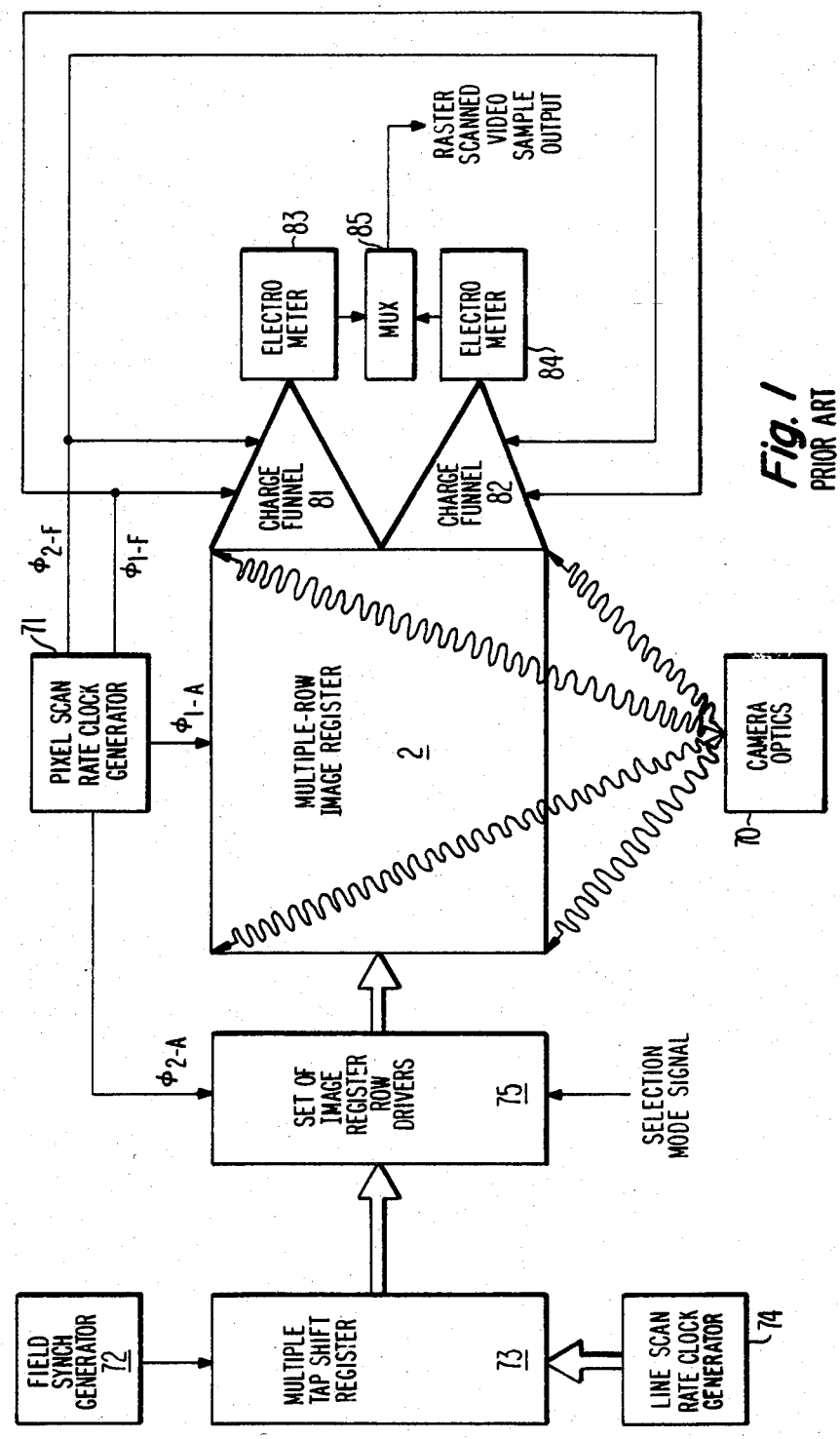
FIG. 1 is a block diagram of a line-transfer CCD imager of the type P. K. Weimer describes in his U.S. patent application Ser. No. 650,615 filed Jan. 14, 1984.

FIG. 1 shows a field transfer type of CCD imager as described by Weimer. A radiant energy (e.g., visible light) image is projected via camera optics 70 into the image register 2 of the imager. The parallel charge transfer channels in image register 2 are not explicitly shown, but they each extend across image register 2 from the left to right. The output ports of the charge transfer channels which are used to accumulate the charge packets providing the upper rows of image samples in image register 2 connect to the input port of a charge funnel 81, and the output ports of the charge transfer channels which are used to accumulate the charge packets providing the lower rows of image samples in image register 2 connect to the input port of a charge funnel 82.

Normally camera optics 70 are of image-inverting type. So, the topmost scan line of the erect image is in registration with the bottommost charge transfer channel in image register 2; the bottommost scan line of the erect image is in registration with the topmost charge transfer channel in image register 2; etc. Conventionally, the lowest row of charge packets are read out of the bottommost charge transfer channel of image register 2 first, to scan the top line of erect image. Then the rows of charge packets are read out of the image register 2 in ascending order to scan the erect image downward line by line.

Charge funnel 81 has an electrometer 83 in cascade connection thereafter, and charge funnel 82 has an electrometer 84 in cascade connection thereafter. Electrometers 83 and 84 are usually of a type in which charge packets are transferred under a floating diffusion for sensing by the gate electrode of a source-follower insulated-gate field effect transistor, with the floating diffusion being clamped to a reset drain potential after each charge packet is sensed.

During field scan times image register 2 and the charge funnels 81, 82 cascaded thereafter are supplied with pixel scan rate clocking signals from generator 11, normally in two or more phases. This causes the serial advance of charge packets in each selected row in image register 2 to generate a train of charge packets successively advanced through one of the charge funnels 81, 82 to a respective one of 83 and 84 electrometers. A multiplexer 85 selects samples of a raster-scanned video output from electrometer 83 response during the first half of field scan and from electrometer 84 response during the second half of field scan.

FIG. 1 shows image register 2 being clocked two-phase, using a direct clock voltage of virtual phase $\phi_{1-A}$ applied to all its charge transfer channels, and using an alternating clock voltage $\phi_{2-A}$ applied to a selected one (or two) of its charge transfer channels by a respective one of a set 75 of register row drivers. Charge funnels 81 and 82 are shown being clocked two-phase by clock voltages with $\phi_{1-F}$ and $\phi_{2-F}$ phases.

A brief description of how the row selection process in image register 2 can be carried out, when line interlace from field to field is not used, is useful in understanding how line-by-line scanning is provided for in generating the raster-scanned sampled video output signal supplied at the output connection of multiplexer 85. (Pixel-by-pixel scanning is provided by the serial read-out of charge packets in each row of image register 2 through one of the charge funnels 81, 82, of course.)

During field retrace, field synchronizing generator 72 introduces field synchronization pulse signal into the input of a multiple-tap shift register 73. This pulse signal is shifted forward from stage to stage in shift register 73 at line scan rate, responsive to clocking signal supplied by line scan rate clock generator 74. Shift register 73 may be of a type using metal-insulator-semiconductor field effect transistors or of a type using a CCD charge transfer channel so it can be constructed by integrated techniques together with image register 2 and the charge funnel transfer channel. In any case, each successive stage of shift register 73 corresponds to a successively scanned out charge transfer channel (or row) of image register 2 and a row driver in set 75 of image register row drivers. When the pulse signal is in the shift register 73 stage corresponding to a particular charge transfer channel in image register 2, it activates a corresponding row driver stage in set 75 of image register row drivers to apply dynamic clocking signals in $\phi_{2-A}$ phase to the selected charge transfer channel in image register 2. The row drivers of set 75 may, for example, each comprise a metal-insulator-semiconductor field effect transistor having its channel selectively rendered conductive to apply $\phi_{2-A}$ clock signal voltage to a selected one of the image register 2 charge transfer channels, responsive to the gate electrode of the row-driver field effect transistor responding to the stage in shift register 73 associated therewith storing the field synchronizing pulse.

When line interlace on alternate fields is used, each charge transfer stage in multiple-tap shift register 73 controls selection of a respective pair of row drivers when the pulse signal appears in that stage. In each pair of row drivers, one driver when selected applies forward clocking signals solely in odd-numbered field scans to an odd-numbered row in the image register 2, and the other driver when selected applies forward clocking signals solely in even-numbered field scans to an adjoining even-numbered row in image register 2. Row drivers controlled by charge transfer stages in multiple-tap shift register 73 in which pulse signal does not currently appear do not apply forward clocking signals to image register 2.

In the FIG. 1 line-transfer CCD imager as described by Weimer charge funnels 81 and 82 are clocked continuously, in synchronism with each other, during all line trace intervals. However, since image charge packets are being transferred through only one of the charge funnels 81 and 82 at a time, the present inventor observes that one can conserve considerable clock power by applying dynamic clocking signals only to that one of charge funnels 81 and 82.

Figure 2:
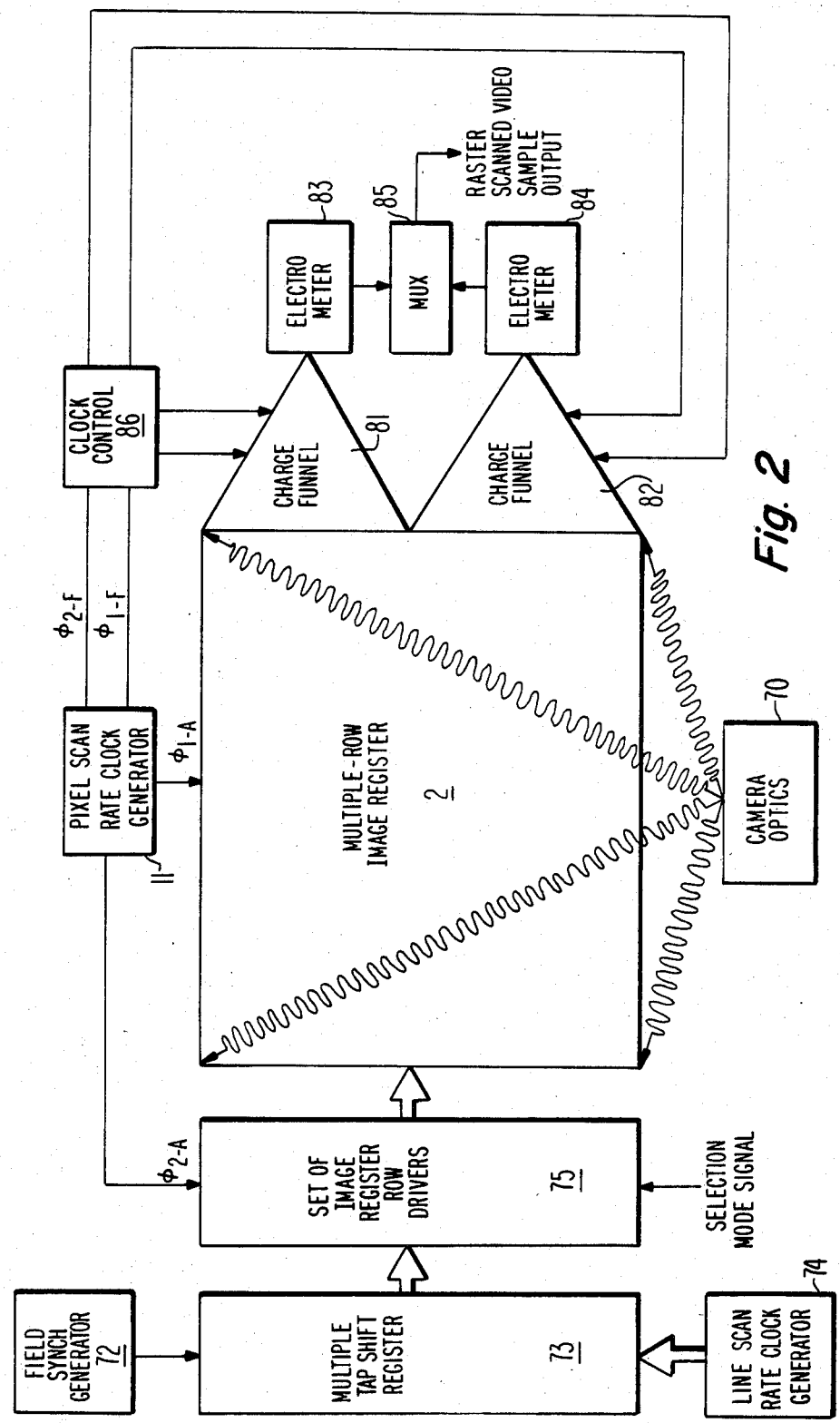
FIG. 2 is a block diagram of a modification of the FIG. 1 line-transfer CCD imager, to conserve clocking power in accordance with the present invention.
Figure 3:
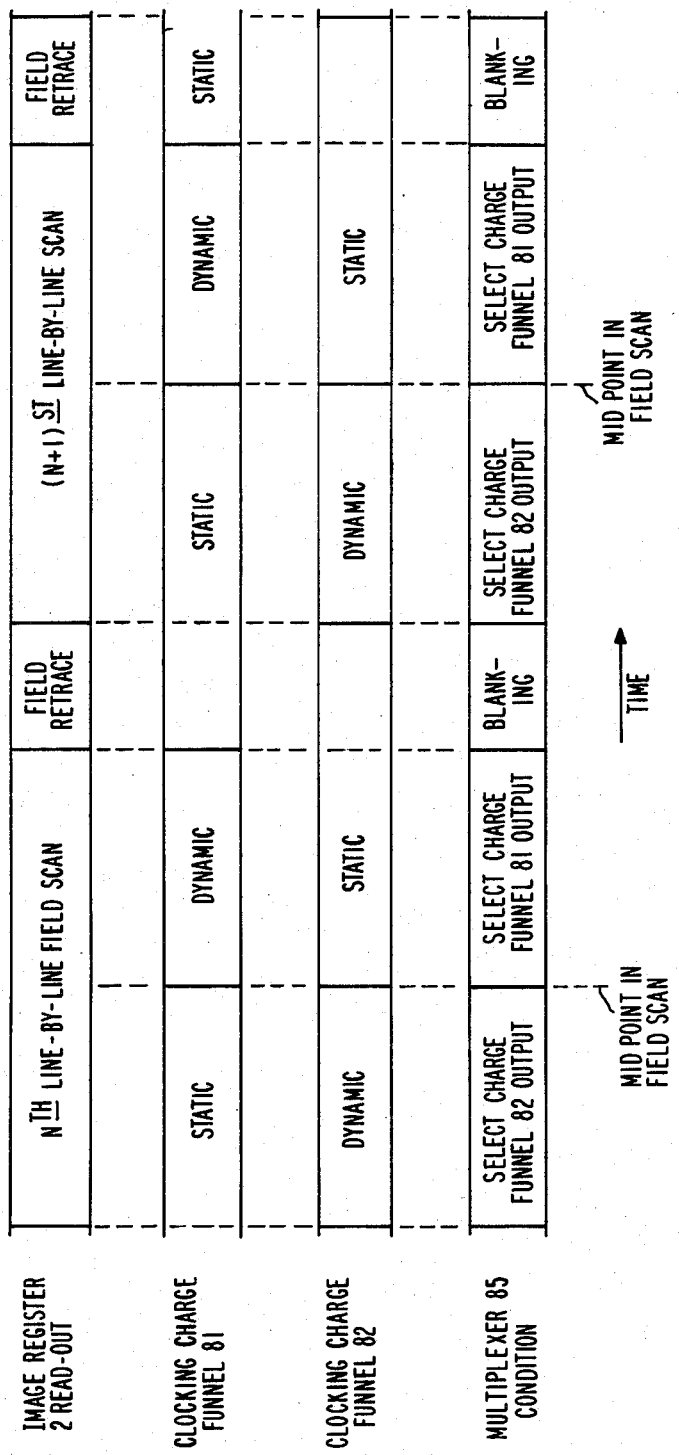
FIG. 3 is a timing diagram of the FIG. 2 line-transfer CCD imager.

FIG. 2 shows the Weimer line-transfer CCD imager of FIG. 1 modified in accordance with the present invention. FIG. 3 is a timing diagram of the operation to be described. Field retrace interval is considered to include those lines in field trace that are not actually used for image transmission.

Clock control circuitry 86 applies dynamic $\phi_{1-F}$ and $\phi_{2-F}$ clock signals to charge funnel 82 when charge packets representative of image samples are being transferred therethrough during the first half of field trace interval. During the second half of field trace interval and during field retrace interval, however, clock control circuitry 86 withholds dynamic clocking voltages from charge funnel 82 and applies static clocking voltages to it. During the second half of field trace interval, while charge funnel 82 receives static clocking voltages, clock control circuitry 86 applies dynamic clocking voltages to charge funnel 81 as charge packets representative of image samples are transferred through it. Then, for the field retrace and for the first half of the succeeding field trace interval, clock control circuitry 86 withholds dynamic clocking voltages from charge funnel 81 and applies static clocking voltages to it. The clocking power for charge funnel 81 and 82 is essentially halved, since each of the charge funnels is dynamically clocked for only half the field trace interval, rather than for the whole field trace interval.

It is most convenient to shift the signal pulse forward in multiple-tap shift register 73 immediately after the end of each line trace interval of multiplexer 85 output signal. Multiplexer 85, while shown in FIG. 3 as continuously selecting charge funnel 82 during earlier half of field scan and continuously selecting charge funnel 81 during later half of field scan, may in fact be operated so as to provide line retrace blanking. Alternatively, line retrace blanking may be provided by other means.

Forward clocking of the selected row of image register 2 must begin before line trace interval is present in the multiplexer 85 output signal, to allow for delay through charge funnel 81 or 82. It is best if the delay through charge funnels 81 and 82 can be kept no longer than the line retrace interval, so the line selection artifact does not appear during line trace and can be suppressed by line retrace blanking. If this cannot be done, the image register 2 rows can be apportioned among a larger numbered plurality of charge funnels. (Or delay can be added in cascade after charge funnels 81 and 82 to cause delays between image register 2 and electrometers 83 and 84 which are longer than a line trace interval but shorter than line trace interval plus line retrace interval. This technique for suppressing line artifacts is taught by P. K. Weimer in his U.S. patent application Ser. No. 688,982, entitled "Removal of Line Selection Artifacts from Trace Portions of Line Transfer CCD Imager Video Output Signals", filed Jan. 4, 1985 and assigned to RCA Corporation.)

What is claimed is:

1. A charge-coupled-device time-division-multiplexer output stage comprising:

a plurality of charge funnels having respective input ends in alignment with each other and having respective output ends;

means for recurrently supplying to the input end of each said charge funnels a succession of charge packet trains, the time period during which each charge packet train is supplied defining a charge packet train interval;

means for applying forward clocking signals to each of said charge funnels for times substantially only so long as charge packet trains are supplied to its input end and for the next charge packet train interval thereafter; and means, sensing the in-channel potential variations at the output ends of each of said charge funnels, for generating the output signal of said CCD time-division-multiplexer output stage.

2. A charge-coupled-device imager for generating fields of a raster scanned output signal responsive to optical images, said imager comprising:

an image register for receiving said optical images, said image register comprising a plurality of component charge-coupled-device line registers in a parallel array, said parallel array being divided into groups of line registers having their respective output ports in parallel alignment;

means for forward clocking selected line registers in said image register to transfer trains of charge packets from their respective output ports, thereby to scan the charge packet contents of said image register;

a respective charge funnel associated with each group of line registers in said image register, each charge funnel having an input port connected to the parallelly aligned output ports of the line registers in the group with which that charge funnel is associated, each charge funnel having an output port narrower than its input port;

means for selectively forward clocking each charge funnel during only a portion of each raster scan field, substantially consisting of the portion of the field when trains of charge packets are applied to the input port of that charge funnel;

electrometer means for sensing the quantity of charge in charge packets supplied thereto as input signal from said charge funnels to generate output signal samples.

3. A charge-coupled-device imager as set forth in claim 2 wherein said charge-coupled-device imager is of line transfer type.

* * * * *